US012154478B2

(12) United States Patent
Xiao

(10) Patent No.: US 12,154,478 B2
(45) Date of Patent: Nov. 26, 2024

(54) DISPLAY PANEL AND DISPLAY DEVICE

(71) Applicant: Shenzhen China Star Optoelectronics Semiconductor Display Technology Co., Ltd., Guangdong (CN)

(72) Inventor: Bo Xiao, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 17/781,000

(22) PCT Filed: May 16, 2022

(86) PCT No.: PCT/CN2022/092913
§ 371 (c)(1),
(2) Date: May 30, 2022

(87) PCT Pub. No.: WO2023/206630
PCT Pub. Date: Nov. 2, 2023

(65) Prior Publication Data
US 2024/0161679 A1   May 16, 2024

(30) Foreign Application Priority Data
Apr. 26, 2022   (CN) .......................... 202210450792.7

(51) Int. Cl.
*G09G 3/20*   (2006.01)
*H03K 19/0175*   (2006.01)

(52) U.S. Cl.
CPC ... *G09G 3/2096* (2013.01); *G09G 2310/0267* (2013.01); *G09G 2320/043* (2013.01);
(Continued)

(58) Field of Classification Search
CPC ......... G09G 3/2096; G09G 2310/0267; G09G 2340/00; G09G 2330/021; G09G 2320/043
See application file for complete search history.

(56) References Cited

U.S. PATENT DOCUMENTS 6,104,370 A   8/2000   Nakagaki et al.
7,528,811 B2   5/2009   Iwabuchi
(Continued)

FOREIGN PATENT DOCUMENTS

CN   104008739   8/2014
CN   104008742   8/2014
(Continued)

OTHER PUBLICATIONS

International Search Report and the Written Opinion Dated Dec. 14, 2022 From the International Searching Authority Re. Application No. PCT/CN2022/092913 and Its Translation Into English. (19 Pages).
(Continued)

*Primary Examiner* — Abbas I Abdulselam

(57) ABSTRACT

The present application discloses a display panel and a display device. The display panel includes a timing controller and a level conversion module, the data enable signal output by the timing controller is used to control the level conversion module to switch the potential of the first control signal and the potential of the second control signal in the vertical blanking interval, and the potential switching interval of the two control signals does not change with the refresh frequency, which can prevent the potential switching interval of the two control signals from being too short.

20 Claims, 4 Drawing Sheets

(52) U.S. Cl.
CPC ... *G09G 2330/021* (2013.01); *G09G 2340/00* (2013.01); *H03K 19/017509* (2013.01)

(56) References Cited

U.S. PATENT DOCUMENTS

| | | | | |
|---|---|---|---|---|
| 2006/0007202 | A1* | 1/2006 | Satoh | G09G 3/22 |
| | | | | 345/204 |
| 2014/0292627 | A1 | 10/2014 | Pyun | |
| 2015/0262528 | A1 | 9/2015 | Takahara | |
| 2016/0042684 | A1* | 2/2016 | Kim | G09G 3/3674 |
| | | | | 345/55 |
| 2021/0097917 | A1 | 4/2021 | Li | |
| 2021/0193007 | A1* | 6/2021 | Cheng | G09G 3/3266 |
| 2022/0350432 | A1 | 11/2022 | Takahashi et al. | |

FOREIGN PATENT DOCUMENTS

| | | |
|---|---|---|
| CN | 104934007 | 9/2015 |
| CN | 106157916 | 11/2016 |
| CN | 107068088 | 8/2017 |
| CN | 108154859 | 6/2018 |
| CN | 207781163 | 8/2018 |
| CN | 109036309 | 12/2018 |
| CN | 109064982 | 12/2018 |
| CN | 109841194 | 6/2019 |
| CN | 109859670 | 6/2019 |
| CN | 110827735 | 2/2020 |
| CN | 111161664 | 5/2020 |
| CN | 114220405 | 3/2022 |
| CN | 216749268 | 6/2022 |
| CN | 115798382 | 3/2023 |
| JP | 05-011722 | 1/1993 |
| JP | 06-318055 | 11/1994 |
| JP | 11-133930 | 5/1999 |
| JP | 2004-341414 | 12/2004 |
| JP | 2006-011024 | 1/2006 |
| JP | 2006-178430 | 7/2006 |
| JP | 2008-022539 | 1/2008 |
| JP | 2013-061684 | 4/2013 |
| KR | 10-2011-0110502 | 10/2011 |
| KR | 10-2012-0059351 | 6/2012 |
| KR | 10-2016-0077254 | 7/2016 |
| KR | 10-2017-0080232 | 7/2017 |
| KR | 10-2018-0027270 | 3/2018 |
| WO | WO 2014/061235 | 4/2014 |
| WO | WO 2021/064509 | 4/2021 |

OTHER PUBLICATIONS

Grounds of Reason of Rejection Dated Jun. 20, 2023 From the Korean Intellectual Property Office Re. Application No. 10-2022-7021470 and Its Translation Into English. (16 Pages).

Notice of Reasons for Refusal Dated Jul. 24, 2024 From the Japan Patent Office Re. Application No. 2002-529654 and Its Translation Into English. (8 Pages).

Notification of Office Action and Search Report Dated Sep. 30, 2024 From the State Intellectual Property Office of the People's Republic of China Re. Application No. 202210450792.7 and Its Translation of Office Action into English. (22 Pages).

* cited by examiner

DISPLAY PANEL AND DISPLAY DEVICE

RELATED APPLICATIONS

This application is a National Phase of PCT Patent Application No. PCT/CN2022/092913 having International filing date of May 16, 2022, which claims the benefit of priority of Chinese Patent Application No. 202210450792.7 filed on Apr. 26, 2022. The contents of the above applications are all incorporated by reference as if fully set forth herein in their entirety.

FIELD AND BACKGROUND OF THE INVENTION

The present application relates to the field of manufacturing a display panel, and in particular, to a display panel and a display device.

With the development of society, more and more display products are currently used in high-end scenarios, and the requirements for the refresh frequency are constantly increasing, and the response time and fluency of the display are also improved. However, as the refresh rate increases, the display time of each frame decreases.

The above display products usually include a timing controller (TCON) and a level shift module (Level Shift). Under the control of the timing controller, the level shift module generates two control signals with opposite phases, and the potential switching time of the two control signals with opposite phases is controlled by the timing of the timing controller. When the refresh frequency becomes smaller, the potential switching interval of the two control signals with opposite phases also becomes smaller.

However, the two control signals with opposite phases are used to drive the corresponding switch devices in the display panel. If the potential switching interval of the two control signals with opposite phases is too small, a workload of the switch devices will be increased, thereby reducing a service life of the switch devices.

SUMMARY OF THE INVENTION

The present application provides a display panel and a display device to alleviate the technical problem that the potential switching interval of two control signals with opposite phases is too small.

In a first aspect, the present application provides a display panel, which includes a timing controller configured to output a corresponding data enable signal according to video data accessed to the timing controller; and a level conversion module connected to the timing controller, and configured to switch a potential of a first control signal and a potential of a second control signal in a vertical blanking interval according to the data enable signal, wherein a phase of the first control signal is opposite to a phase of the second control signal.

In some embodiments of the present application, the level conversion module includes: a vertical blanking interval identification unit connected to the timing controller, and configured to identify the vertical blanking interval according to the data enable signal; a delay circuit connected to the vertical blanking interval identification unit, and configured to output a switching instruction after delaying a set time; and a level switching unit connected to the delay circuit, and configured to switch the potential of the first control signal and the potential of the second control signal according to the switching instruction.

In some embodiments of the present application, the vertical blanking interval identification unit is configured to identify the vertical blanking interval according to a comparison result between a low-potential duration of the data enable signal and a high-potential duration of the data enable signal.

In some embodiments of the present application, the vertical blanking interval identification unit is configured to determine the vertical blanking interval according to whether one continuous low-potential duration is greater than or equal to two high-potential durations.

In some embodiments of the present application, the delay circuit is configured to output the switching instruction in a next one of vertical blanking interval, and each of a potential switching time of the first control signal and a potential switching time of the second control signal is present in the next one of the vertical blanking interval.

In some embodiments of the present application, the potential switching time of the first control signal is the same as the potential switching time of the second control signal.

In some embodiments of the present application, the delay circuit includes a register configured to store the set time.

In some embodiments of the present application, the level switching unit is configured to control the first control signal and the second control signal to perform level switching synchronously according to the switching instruction; and wherein, when the potential of the first control signal is switched from a low potential to a high potential, the potential of the second control signal is switched from a high potential to a low potential; and when the potential of the first control signal jumps from a high potential to a low potential, the potential of the second control signal jumps from a low potential to a high potential.

In some embodiments of the present application, the display panel further includes a gate driving circuit, the gate driving circuit includes a plurality of cascaded gate driving units, each of the gate driving units is configured to output a corresponding scan signal, at least one of the gate driving units is connected to the level conversion module to access the first control signal and the second control signal.

In some embodiments of the present application, each of the gate driving units includes a first pull-down unit and a second pull-down unit, the first pull-down unit is connected with the level conversion module to control the scan signal to be at a low level according to the first control signal, and the second pull-down unit is connected to the level conversion module to control the scan signal to be at a low level according to the second control signal; and wherein a duty cycle of the first pull-down unit alternates with a duty cycle of the second pull-down unit.

In a second aspect, the present application provides a display device including the display panel in at least one of the above embodiments, wherein the data enable signal is obtained according to decoded video data.

In the display panel and the display device provided by the present application, the data enable signal output by the timing controller controls the level conversion module to switch the potential of the first control signal and the potential of the second control signal in the vertical blanking interval. The potential switching interval does not change with the refresh frequency, and the potential switching interval is kept constant, which can prevent the potential switching interval of the two control signals from being too short, and improve the service life of the corresponding switch devices in the display panel.

DESCRIPTION OF SPECIFIC EMBODIMENTS OF THE INVENTION

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Figure 1:
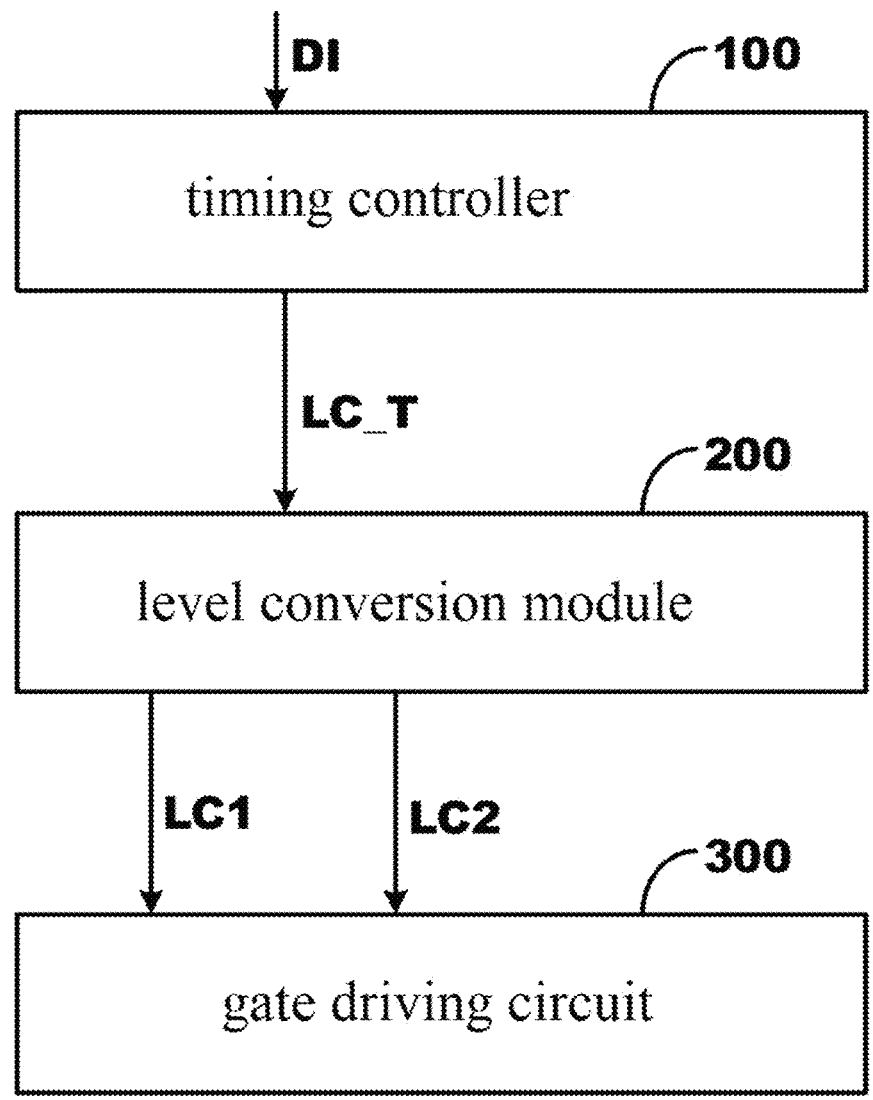
FIG. 1 is a schematic structural diagram of a display panel in the related art.

The reason that the potential switching interval of the two control signals with opposite phases mentioned above is too small can be referred to the display panel shown in FIG. 1. The display panel includes a timing controller 100, a level conversion module 200 and a gate driving circuit 300. The output terminal of the timing controller 100 is connected to the input terminal of the level conversion module 200, the output terminal of the level conversion module 200 is connected to the input terminal of the gate driving circuit, and the level conversion module 200 is configured to control the high-low potential switching of the first control signal LC1 and the second control signal LC2 according to the control signal LC_T. However, the high-low potential switching time varies with the refresh frequency and cannot be fixed, which may easily result in an excessively small switching interval between two adjacent high-low potentials, thereby reducing the reliability of the gate driving circuit 300.

Figure 2:
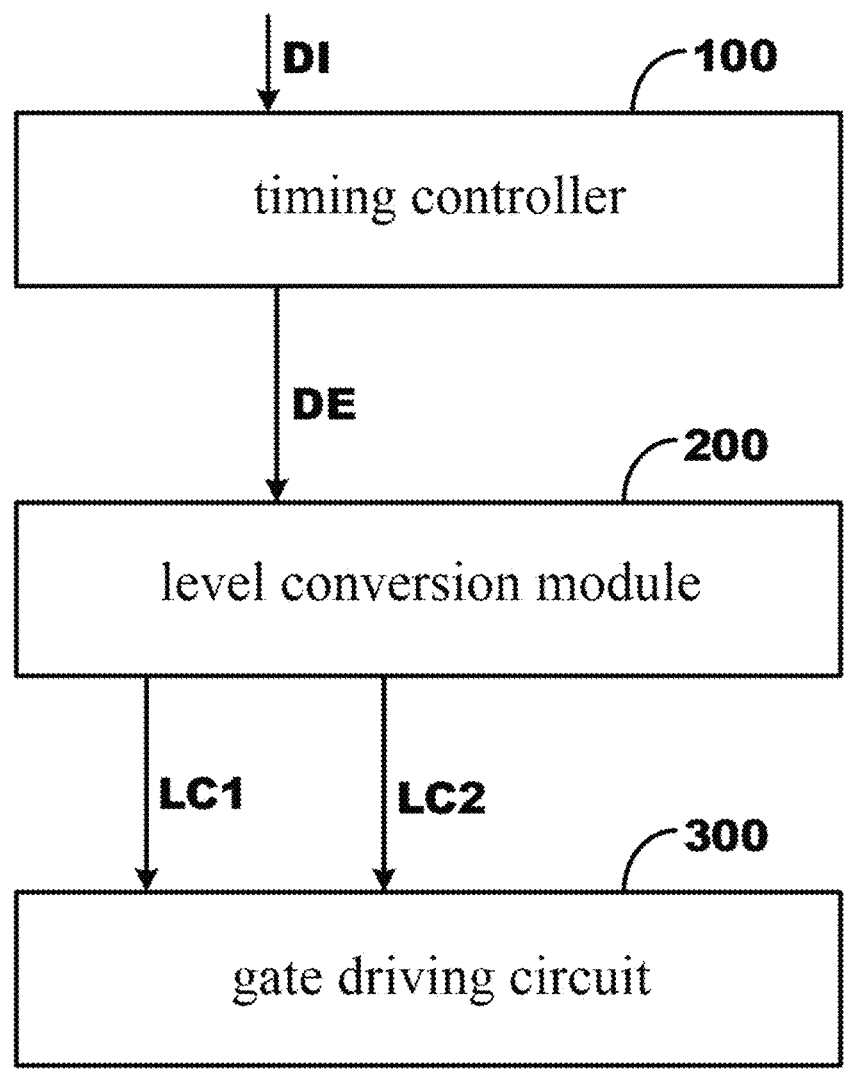
FIG. 2 is a schematic diagram of a first structure of a display panel provided by an embodiment of the present application.
Figure 3:
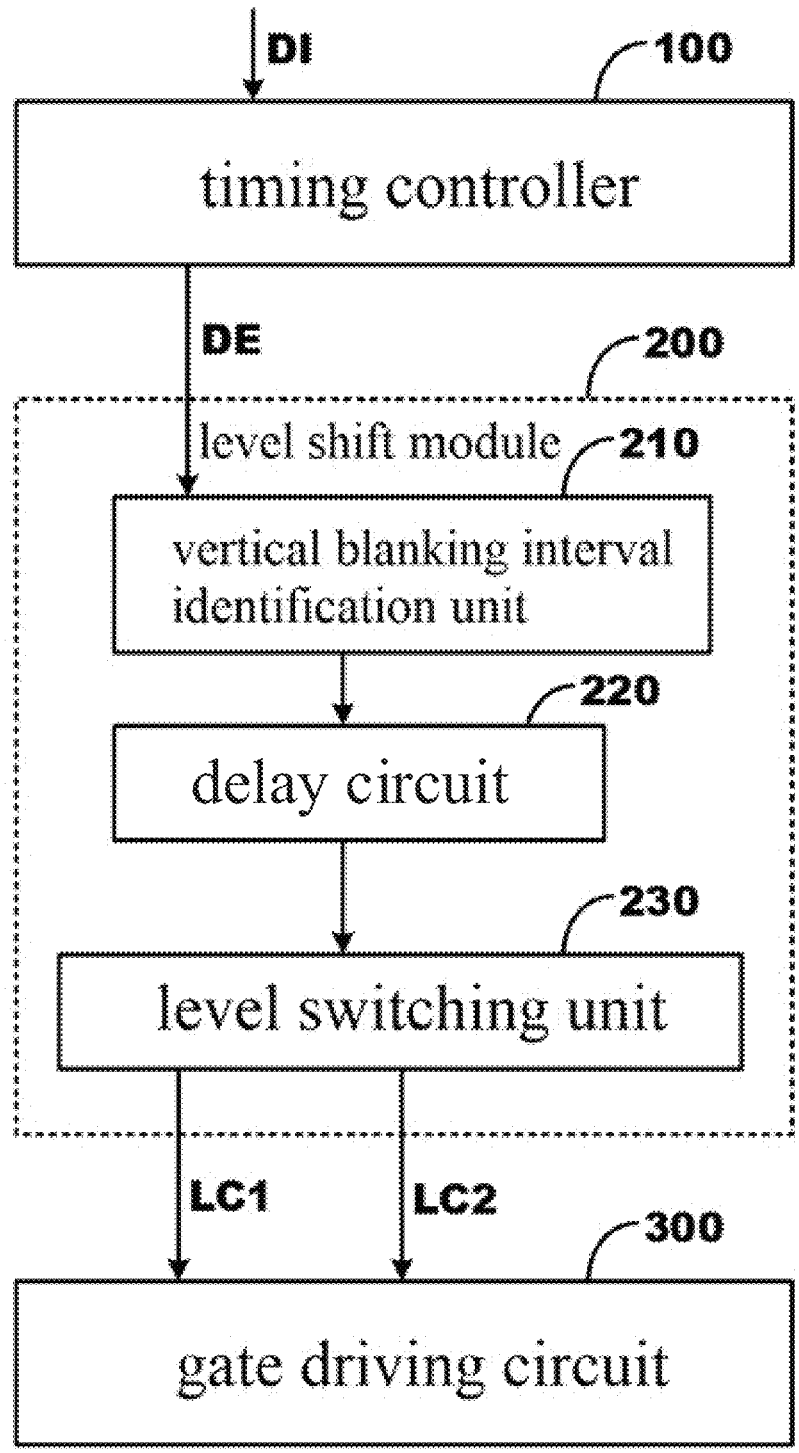
FIG. 3 is a schematic diagram of a second structure of a display panel according to an embodiment of the present application.
Figure 4:
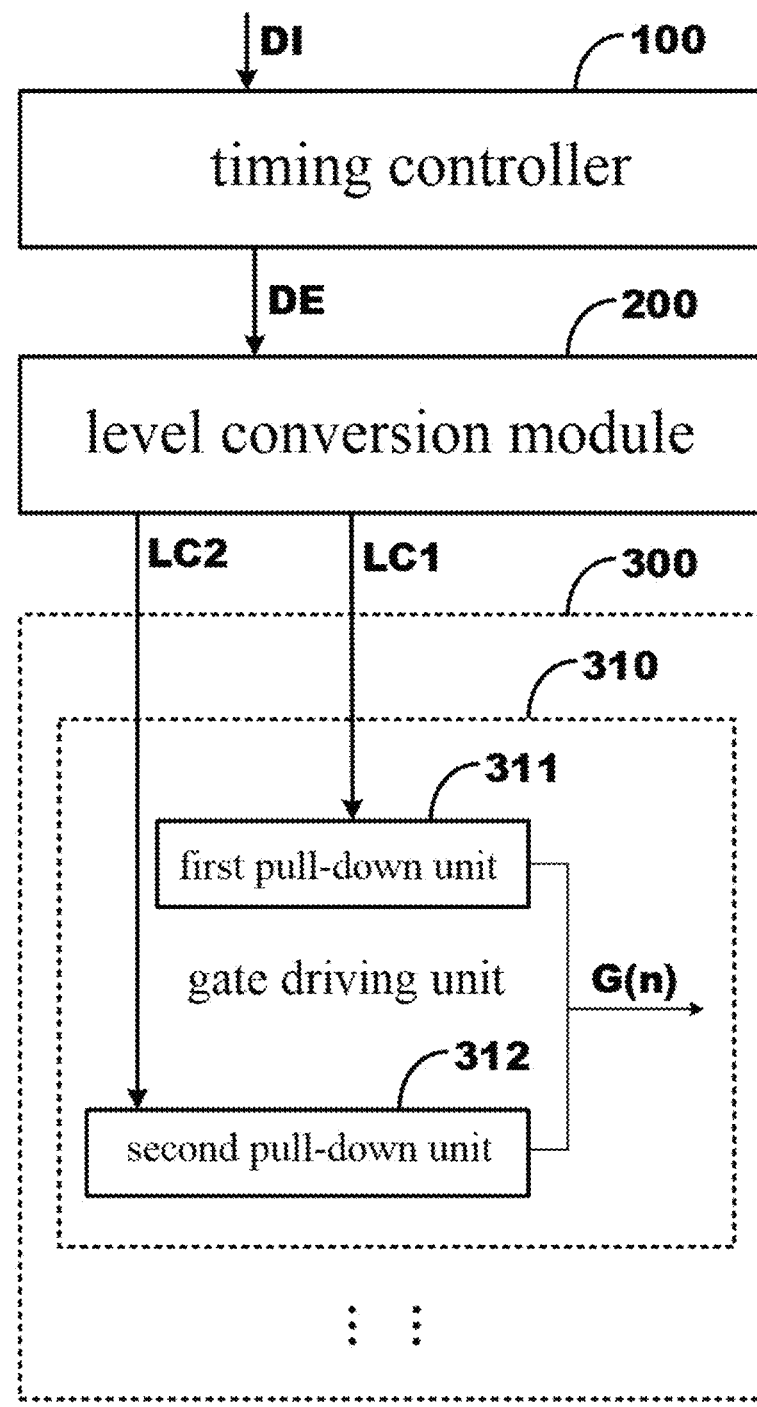
FIG. 4 is a schematic diagram of a third structure of a display panel according to an embodiment of the present application.

In view of the above-mentioned technical problem that the potential switching interval of two control signals with opposite phases is too small, this embodiment provides a display panel. Referring to FIG. 2 to FIG. 4, as shown in FIG. 2, the display panel includes a timing controller 100 and a level conversion module 200. The timing controller 100 is configured to output the corresponding data enable signal DE according to the video data DI accessed to the timing controller 100; the level conversion module 200 is connected to the timing controller 100 and is configured to data enable signal DE switches the potential of the first control signal LC1 and the potential of the second control signal LC2 in the vertical blanking interval (V-Blank) according to data enable signal DE, and the phase of the first control signal LC1 is opposite to the phase of the second control signal LC2.

It is appreciated that, in the display panel provided in this embodiment, the level conversion module 200 is controlled by the data enable signal DE output from the timing controller 100 to switch the potential of the first control signal LC1 and the second control signal LC2 in the vertical blanking interval. The potential switching interval of the two control signals does not change with the change of the refresh frequency, and the potential switching interval is kept constant, which can prevent the potential switching interval of the two control signals from being too short, and improve the service life of the corresponding one of the switch device in the display panel.

The above-mentioned potential switching interval is generally greater than or equal to 1.5 seconds.

It should be noted that the potential of the first control signal LC1 and the potential of the second control signal LC2 are switched only once in one vertical blanking interval, and there is an effective display area between two adjacent vertical blanking intervals. Therefore, the above-mentioned display panel can control the potential switching interval of the first control signal LC1 and the second control signal LC2 and keep it relatively constant.

Meanwhile, since the above-mentioned display panel can control the potential switching interval of the first control signal LC1 and the second control signal LC2 not to be too small, the switching frequency of the corresponding switch device in the display panel is reduced, which is beneficial to reduce the power consumption of the display panel.

The present embodiment uses the data enable signal DE to control the level conversion module 200 configured with a new function to switch the potential of the first control signal LC1 and the potential of the second control signal LC2 in the vertical blanking interval, and output the first control signal LC1 and the second control signal LC2 subjected to potential switching, so that the potential switching interval of the two control signals can be prevented from being too short.

It should be noted that the above-mentioned timing controller 100 can also be fabricated as a corresponding chip and applied to a display panel, which can reduce the space occupied by the display panel and facilitate the realization of a narrow bezel of the display panel.

In one embodiment, the display panel further includes a flash memory, and the flash memory is connected to the timing controller 100.

In one embodiment, as shown in FIG. 3, the level conversion module 200 includes a vertical blanking interval identification unit 210, a delay circuit 220 and a level switching unit 230. The vertical blanking interval identification unit 210 is connected to the timing controller 100, and is configured to identify the vertical bl anking interval according to the data enable signal DE; the delay circuit 220 is connected to the vertical blanking interval identification unit 210, and is configured to output switching instructions after delaying the set time; the level switching unit 23 0 is connected to the delay circuit 220, and is configured to switch the poten tial of the first control signal LC1 and the potential of the second control signal LC2 a ccording to the switching instruction.

It should be noted that the above-mentioned level conversion module 200 can be made into a corresponding chip and applied to the display panel, which can reduce the space occupied by the level conversion module 200 in the display panel and is beneficial to realize the narrow bezel of the display panel.

In addition, the level conversion module 200 in the conventional technology usually only has a level conversion function, but the present embodiment reconstructs the structure of the level conversion module 200 and provides new functions or effects, so as to prevent the potential switching interval of the above two control signals from being too short.

In one embodiment, the vertical blanking interval identification unit 210 identifies the vertical blanking interval according to the comparison result of the low-potential duration of the data enable signal DE and the high-potential duration of the data enable signal DE.

It should be noted that, in this embodiment, the vertical blanking interval identification unit 210 may independently count and compare the number and duration of low potentials and the number and duration of high potentials in the data enable signal DE to obtain the above comparison result, thereby identifying the time period in which the vertical blanking interval presents.

In one embodiment, the vertical blanking interval identification unit 210 is configured to determine the vertical blanking interval according to one continuous low-potential duration greater than or equal to two high-potential durations.

It should be noted that, in this embodiment, when the vertical blanking interval identification unit 210 detects one continuous low-potential duration that is greater than or equal to two high-potential durations, the one continuous low-potential duration is determined to be the time period corresponding to the vertical blanking interval.

In one embodiment, the delay circuit 220 is configured to out put a switching instruction in the next vertical blanking interval, and the potential swit ching time of the first control signal LCI and the potential switching time of the secon d control signal LC2 both present in the next vertical blanking interval.

In one of the embodiments, the delay circuit 220 includes a register for storing the set time.

It should be noted that, when the vertical blanking interval identification unit 210 identifies the current vertical blanking interval, the current vertical blanking interval may have elapsed for some time, and at this time, the above-mentioned set time is used to carry out the potential switching of the first control signal LC1 and the potential switching of the second control signal LC2, so that the potential switching time of the first control signal LC1 and the potential switching time of the second control signal LC2 may fall into the effective display area, which is prevented by the technical solution of the present application.

In one embodiment, the potential switching time of the first control signal LC1 is the same as the potential switching time of the second control signal LC2.

In one of the embodiments, the delay unit 220 includes a register for storing the set time.

In one embodiment, the level switching unit 230 is configured to control the first control signal LC1 and the second control signal LC2 to perform level switching synchronously according to the switching instruction; wherein, when the potential of the first control signal LC1 is switched from a low potential to a high potential, the potential of the second control signal LC2 is switched from a high potential to a low potential; and when the potential of the first control signal LC1 jumps from a high potential to a low potential, the potential of the second control signal LC2 jumps from a low potential to a high potential.

In one embodiment, the display panel further includes a gate driving circuit 300, the gate driving circuit 300 includes a plurality of cascaded gate driving units 310, each of the gate driving units 310 is configured to output a corresponding scan signal G(n), at least one of the gate driving units 310 is connected to the level conversion module 200 to access the first control signal LC1 and the second control signal LC2.

It should be noted that, the above-mentioned set time may be determined according to the switching time of the first control signal LC1 and the switching time of the second control signal LC2 of the gate driving circuit 300. Since the potential switching interval of the above-mentioned two control signals, the first control signal LC1 and the second control signal LC2, does not change with the change of the refresh frequency, the potential switching interval is kept constant, which can prevent the potential switching interval of the two control signals from being too short, and the service life of the corresponding switch device in the display panel is increased, thereby improving the reliability of the gate driving circuit 300.

In one embodiment, as shown in FIG. 4, the gate driving unit 310 includes a first pull-down unit 311 and a second pull-down unit 312, and the first pull-down unit 311 is connected to the level conversion module 200 to control the scan signal G(n) to be at a low level according to the first control signal LC1, and the second pull-down unit 312 is connected to the level conversion module 200 to control the scan signal G(n) to be at a low level according to the second control signal LC2; wherein a duty cycle of the first pull-down unit 311 alternates with a duty cycle of the second pull-down unit 312.

In one embodiment, the gate driving unit 310 includes a first pull-down unit 311 and a second pull-down unit 312. The first pull-down unit 311 is connected to the level conversion module 200 to control the scan signal G(n) to be at a low level according to the second control signal LC2, the second pull-down unit 312 is connected to the level conversion module 200 to control the scan signal G(n) to be at a low level according to the first control signal LC1; wherein the duty cycle of the first pull-down unit 311 alternates with the duty cycle of the second pull-down units 312.

It should be noted that during the working cycle of the first pull-down unit 311, the first pull-down unit 311 controls the scan signal G(n) to be at a low potential; during the working cycle of the second pull-down unit 312, the second pull-down unit 312 controls the scan signal G(n) to be at a low potential. It is also possible that the duty cycle of the first pull-down unit 311 and the duty cycle of the second pull-down unit 312 have overlapping time periods, that is, the first pull-down unit 311 and the second pull-down unit 312 may also synchronously control the scan signal G(n) at a low potential.

The first pull-down unit 311 may include a first transistor as a switch device, one of the source/drain of the first transistor is connected to the low potential line, another one of the source/drain of the first transistor is connected to the scan line, and the gate of the first transistor is connected to the first control line.

The second pull-down unit 312 may include a second transistor as a switch device, one of the source/drain of the second transistor is connected to the low potential line, another one of the source/drain of the second transistor is connected to the scan line, and the gate of the second transistor is connected to the second control line.

The low-potential line is configured to transmit low-potential signals. The scan lines are configured to transmit the above-mentioned scan signal G(n). The first control line is configured to transmit the first control signal LC1. The second control line is configured to transmit the second control signal LC2. The frequency of the first control signal LC1 may be the same as the frequency of the second control signal LC2. The first control signal LC1 and the second control signal LC2 are both pulse signals. Each of the pulse of the first control signal LC1 and the pulse of the second control signal LC2 can be, but are not limited to, a high potential or a low potential, which can be selected according to a channel type of the first transistor and the second transistor. For example, when the first transistor and the second transistor are N-channel thin film transistors, the pulse of the first control signal LC1 and the pulse of the second control signal LC2 are high potentials; and when the first and second transistors are P-channel thin film transistors, the pulse of the first control signal LC1 and the pulse of the second control signal LC2 are low potentials.

It should be noted that, because the first control signal LC1 and the second control signal LC2 reduce the switching frequency of the first transistor and the second transistor, not only the power consumption of the display panel can be reduced, but also the service life of the gate driving circuit 300 can be increased.

In one embodiment, the display panel further includes a glass substrate, and the gate driving circuit 300 is fabricated on the glass substrate. In the present application, the first control signal LC1 and the second control signal LC2 can be used to prevent the first transistor, the second transistor or the circuit connected to the first transistor and the second transistor in the gate driving circuit 300 from generating a large current, causing the glass substrate to melt, resulting in a large burning area and thus losing the maintenance value. Moreover, it can also prevent safety accidents such as fires.

The gate driver circuit 300 can also be a gate-driver-on-array (GOA) circuit, which can use the original process of the display panel to manufacture the driver circuit of the horizontal scan lines on the substrate around the display area, which can be used to replace the external integrated circuit/chip (IC) to complete the driving of the horizontal scan lines.

In one of the embodiments, this embodiment provides a display device, the display device includes the display panel in at least one of the above embodiments, wherein the data enable signal DE is obtained according to the decoded video data DI.

It is appreciated that, in the display panel provided in this embodiment, the level conversion module 200 is controlled by the data enable signal DE output from the timing controller 100 to switch the potential of the first control signal LC1 and the second control signal LC2 in the vertical blanking interval. The potential switching interval of the two control signals does not change with the change of the refresh frequency, and the potential switching interval is kept constant, which can prevent the potential switching interval of the two control signals from being too short, and improve the service life of the corresponding one of the switch device in the display panel.

It should be noted that the above-mentioned display panel can be, but is not limited to, a liquid crystal display panel, and can also be a self-luminous display panel, for example, an organic light-emitting diode (OLED) display panel, a micro-light-emitting diode (Micro-LED) display panel, mini-light-emitting diode (Mini-LED) display panel, or quantum dot light-emitting diode (QLED) display panel, etc.

The above-mentioned display devices, as devices for displaying video or still images, can be not only fixed terminals such as a television, desktop computers, monitors, billboards etc., but also mobile terminals such as mobile phones, tablet computers, mobile communication terminals, electronic notepads, electronic books, multimedia players, navigators, laptops etc., and also wearable electronic devices such as smart watches, smart glasses, virtual reality devices, augmented reality devices, etc.

It is appreciated that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. A display panel, comprising:
    a timing controller configured to output a corresponding data enable signal according to video data accessed to the timing controller; and
    a level conversion module connected to the timing controller, and configured to switch a potential of a first control signal and a potential of a second control signal in a vertical blanking interval according to the data enable signal, wherein a phase of the first control signal is opposite to a phase of the second control signal.

2. The display panel according to claim 1, wherein the level conversion module comprises:
    a vertical blanking interval identification unit connected to the timing controller, and configured to identify the vertical blanking interval according to the data enable signal;
    a delay circuit connected to the vertical blanking interval identification unit, and configured to output a switching instruction after delaying a set time; and
    a level switching unit connected to the delay circuit, and configured to switch the potential of the first control signal and the potential of the second control signal according to the switching instruction.

3. The display panel according to claim 2, wherein the vertical blanking interval identification unit is configured to identify the vertical blanking interval according to a comparison result between a low-potential duration of the data enable signal and a high-potential duration of the data enable signal.

4. The display panel according to claim 3, wherein the vertical blanking interval identification unit is configured to determine the vertical blanking interval according to whether one continuous low-potential duration is greater than or equal to two high-potential durations.

5. The display panel according to claim 2, wherein the delay circuit is configured to output the switching instruction in a next one of vertical blanking interval, and each of a potential switching time of the first control signal and a potential switching time of the second control signal is present in the next one of the vertical blanking interval.

6. The display panel according to claim 5, wherein the potential switching time of the first control signal is the same as the potential switching time of the second control signal.

7. The display panel according to claim 2, wherein the delay circuit comprises a register configured to store the set time.

8. The display panel according to claim 2, wherein the level switching unit is configured to control the first control signal and the second control signal to perform level switching synchronously according to the switching instruction; and
    wherein, when the potential of the first control signal is switched from a low potential to a high potential, the potential of the second control signal is switched from a high potential to a low potential; and when the potential of the first control signal jumps from a high potential to a low potential, the potential of the second control signal jumps from a low potential to a high potential.

9. The display panel according to claim 1, wherein the display panel further comprises a gate driving circuit, the gate driving circuit comprises a plurality of cascaded gate driving units, each of the gate driving units is configured to output a corresponding scan signal, at least one of the gate driving units is connected to the level conversion module to access the first control signal and the second control signal.

10. The display panel according to claim 9, wherein each of the gate driving units comprises a first pull-down unit and a second pull-down unit, the first pull-down unit is connected with the level conversion module to control the scan signal to be at a low level according to the first control signal, and the second pull-down unit is connected to the level conversion module to control the scan signal to be at a low level according to the second control signal; and wherein a duty cycle of the first pull-down unit alternates with a duty cycle of the second pull-down unit.

11. A display device, comprising the display panel of claim 1, wherein the data enable signal is obtained according to decoded video data.

12. The display device according to claim 11, wherein the level conversion module comprises:
a vertical blanking interval identification unit connected to the timing controller, and configured to identify the vertical blanking interval according to the data enable signal;
a delay circuit connected to the vertical blanking interval identification unit, and configured to output a switching instruction after delaying a set time; and
a level switching unit connected to the delay circuit, and configured to switch the potential of the first control signal and the potential of the second control signal according to the switching instruction.

13. The display device according to claim 12,
wherein the vertical blanking interval identification unit is configured to identify the vertical blanking interval according to a comparison result between a low-potential duration of the data enable signal and a high-potential duration of the data enable signal.

14. The display device according to claim 13, wherein the vertical blanking interval identification unit is configured to determine the vertical blanking interval according to whether one continuous low-potential duration is greater than or equal to two high-potential durations.

15. The display device according to claim 12, wherein the delay circuit is configured to output the switching instruction in a next one of vertical blanking interval, and each of a potential switching time of the first control signal and a potential switching time of the second control signal is present in the next one of the vertical blanking interval.

16. The display device according to claim 15, wherein the potential switching time of the first control signal is the same as the potential switching time of the second control signal.

17. The display device according to claim 12, wherein the delay circuit comprises a register configured to store the set time.

18. The display device according to claim 12, wherein the level switching unit is configured to control the first control signal and the second control signal to perform level switching synchronously according to the switching instruction; and wherein, when the potential of the first control signal is switched from a low potential to a high potential, the potential of the second control signal is switched from a high potential to a low potential; and when the potential of the first control signal jumps from a high potential to a low potential, the potential of the second control signal jumps from a low potential to a high potential.

19. The display device according to claim 11, wherein the display panel further comprises a gate driving circuit, the gate driving circuit comprises a plurality of cascaded gate driving units, each of the gate driving units is configured to output a corresponding scan signal, at least one of the gate driving units is connected to the level conversion module to access the first control signal and the second control signal.

20. The display device according to claim 19, wherein each of the gate driving units comprises a first pull-down unit and a second pull-down unit, the first pull-down unit is connected with the level conversion module to control the scan signal to be at a low level according to the first control signal, and the second pull-down unit is connected to the level conversion module to control the scan signal to be at a low level according to the second control signal; and wherein a duty cycle of the first pull-down unit alternates with a duty cycle of the second pull-down unit.

* * * * *